(12) United States Patent
Patterson

(10) Patent No.: US 6,441,889 B1
(45) Date of Patent: Aug. 27, 2002

(54) LIDAR WITH INCREASED EMITTED LASER POWER

(75) Inventor: Scott W. Patterson, Atlanta, GA (US)

(73) Assignee: P.A.T.C.O. Properties, Inc., Reno, NV (US)

( * ) Notice: Subject to any disclaimer, the term of this patent is extended or adjusted under 35 U.S.C. 154(b) by 0 days.

(21) Appl. No.: 09/725,994

(22) Filed: Nov. 29, 2000

(51) Int. Cl.[7] .............................. G01P 3/36; G01C 3/08; G02B 27/10; G02B 6/00
(52) U.S. Cl. ..................... 356/28; 356/5.01; 359/618; 385/147
(58) Field of Search ............... 356/28.5, 28, 5.01–5.15; 359/618; 385/147

(56) References Cited

U.S. PATENT DOCUMENTS

| | | | |
|---|---|---|---|
| 3,701,044 A | 10/1972 | Paoli et al. | |
| 3,702,975 A | 11/1972 | Miller | |
| RE31,806 E | 1/1985 | Scifres et al. | |
| 5,221,956 A | 6/1993 | Patterson et al. | |
| 5,271,079 A | * 12/1993 | Levinson | |

* cited by examiner

Primary Examiner—Stephen C. Buczinski
(74) Attorney, Agent, or Firm—Chase Law Firm, L.C.

(57) ABSTRACT

A traffic LIDAR device is presented with an increased laser power output in compliance with the IEC 825 standard for class one-type laser systems. Increased laser emitter power output is accomplished by reshaping the emitter source output using an optical fiber which has an inside diameter greater than the minimum dimension of the emitter source. The resulting increased cross-section of the output pulse overcomes the power output limitation that would otherwise be dictated by the emitter minimum dimension.

14 Claims, 2 Drawing Sheets

LIDAR WITH INCREASED EMITTED LASER POWER

BACKGROUND OF THE INVENTION

This invention relates generally to a method and apparatus for increasing the emitted laser power of a speed and/or range detector, and more particularly, to a method and apparatus for increasing the laser power output of a LIDAR device for law enforcement speed measurement and for mapping and surveying by combining and reshaping the emitter source output in an optical fiber to increase the usable power while remaining compliant with laser safety regulations, Laser speed and range measurement devices are widely utilized in traffic speed enforcement. The light detection and ranging (LIDAR) device emits a short pulse of infrared light that is directed in a narrow beam towards a selected target. The light pulse strikes the target and is typically reflected in all directions. A small portion of this light pulse is reflected back towards the LIDAR device. This return energy is collected and focused on a sensitive detector that then converts the light pulse energy to an electrical pulse. A high speed clock counts as the light pulse travels from the LIDAR device to the target and back to determine the total trip time. Using the known speed of light, an onboard computer determines the range to the target. For speed calculations, multiple ranges are taken and the change in range over a short period of time is determined.

Typically, police LIDAR speed guns and survey range finders such as disclosed in U.S. Pat. No. 5,221,956 to Patterson et al., use stripe array laser diode emitters to emit the pulse of infrared energy required to measure the distance to targets at significant ranges. The maximum range that a system can achieve is proportional to the amount of energy emitted per pulse by the laser.

The International Electrotechnical Commission (IEC) is a world-wide organization for standardization comprising all national electrotechnical committees. The object of the IEC is to invoke international cooperation on all questions concerning standardization in the electrical and electronic fields through publication of international standards. One such standard is IEC 825-1 which addresses safety of laser products. The IEC 825-1 standard determines limits through various properties of the laser, including wavelength, shape and size of source, pulse width, duration of pulse, and divergence. Most of these properties cannot be altered to allow more power output without detrimental effects in one or more of the other areas. The new IEC 825-1 standard (1993-11) changes the Accessible Emission Limits (AEL) for class 1 lasers.

The amount of energy that is emitted from these lasers is typically limited by the laser safety regulations of the country where the units are used. Most countries outside of the United States use the IEC 825 standard as a basis for their limits of laser output. The most recent version of this standard (1993-11) significantly limits the allowable laser output for what is termed "class one" type laser systems especially when in the configurations used by laser speed guns and survey guns. These output limits impact the usefulness of the speed guns and survey products due to the resulting shorter range performance.

The IEC 825 standard determines limits through various properties of the laser, including wavelength, shape and size of source, pulse width, duration of pulse, and divergence, to name a few. Most properties cannot be altered to allow more power output without detrimental effects on other technical areas. The laser sources typically used in these types of devices are small stacks of stripe laser emitters. When these emitters are combined with the typical optics required for laser speed guns or survey devices, an angular source size is defined.

Generally, the IEC standard allows more power output for larger angular source sizes. The typical overall angular dimensions of these stripe array lasers are considered large according to the IEC standard. The IEC standard specifically addresses the allowable output power of laser arrays. According to the standard however, when evaluating an array, each emitter stripe must be evaluated separately. When evaluated separately, the size of each stripe is assumed to be equal to the smallest dimension. Because the stripes are very thin, any advantage gained by size of the emitter is eliminated because usable power is limited by the stripe configuration. Thus, the effectiveness of LIDAR speed guns and survey products is limited due to the resulting shorter range performance dictated by IEC 825.

SUMMARY OF THE INVENTION

It is therefore a primary object of the present invention to present a method and apparatus for increasing the power output of a laser emitter by increasing the apparent size of the emitter.

Another important object of the present invention is to provide a method and apparatus as aforesaid, which increases the apparent size of the smallest dimension of the emitter.

Yet another important object of the present invention is to provide a method and apparatus as aforesaid, which reshapes the laser emission.

Still another important object of the present invention is to provide a method and apparatus as aforesaid, which presents a generally circular apparent cross-section of the emitter.

Yet another important object of the present invention is to provide a method and apparatus as aforesaid, which increases the effective range of the LIDAR.

Another important object of the present invention is to provide a method and apparatus as aforesaid, which presents a homogeneous emitter output.

These and other objects of the present invention are achieved by injecting the output of a laser emitter into an optical fiber having a generally circular cross-section. The inside diameter of the optical fiber is greater than the smallest dimension of the laser emitter. Thus, the apparent size of the laser emitter at the output of the optical fiber allows an increase in the power output of the LIDAR, which is a function of the smallest dimension of the emitter.

Other objects and advantages of this invention will become apparent from the following description taken in connection with the accompanying drawings wherein is set forth by way of illustration and example, an embodiment of this invention.

DETAILED DESCRIPTION

Figure 1:
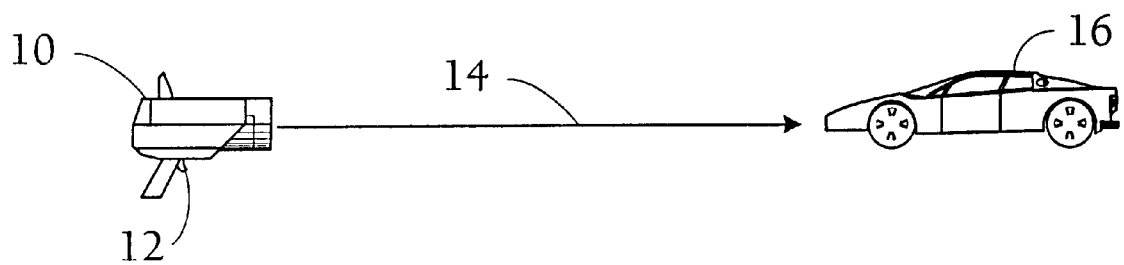
FIG. 1 is a diagrammatic illustration of a LIDAR and a target vehicle.

Turning more particularly to the drawings, FIG. 1 illustrates a hand held traffic LIDAR gun 10 having an operator actuated trigger 12. The gun 10 is of a type generally shown in U.S. Pat. No. 5,221,956 to Patterson et al. Upon actuation of the trigger 12, infrared laser energy 14 is emitted from LIDAR gun 10 in a narrow beam and directed towards a target vehicle 16. Beam 14 is emitted from a transmitting diode 18 which is diagrammatically shown in FIGS. 2 and 3. A typical shape of emitter source 18 is an array of three parallel stripes 20 each about 0.25 millimeter long, oriented in a square pattern such that each stripe 20 is separated from an adjacent stripe by approximately 0.125 millimeter. Alternatively, the emitter source may consist of 1, 2, 4 or more stripes. A typical laser emitter source is part number PGAU3509 from Perkin-Elmer Optoelectronics.

Figure 4:
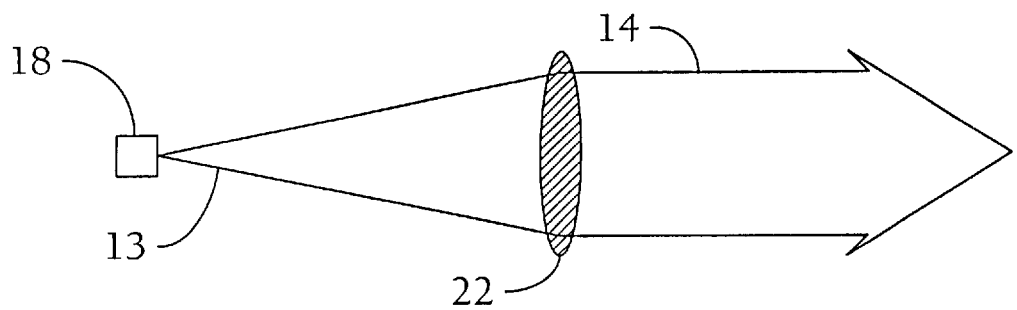
FIG. 4 diagrammatically illustrates a prior art laser system with the emitter of FIG. 2 and an emission aperture.

The laser energy is emitted from diode 18 in response to actuation of trigger 12 which enables a pulse generator (not shown) which fires diode 18. Approximately 200 pulses per second are emitted from diode 18, which may be of the gallium-arsenide type. A gallium-arsenide laser produces laser energy having a wave-length of approximately 905 nanometers with a 15 nanosecond pulse width. As illustrated in FIG. 4, emitted beam 13 passes through lens 22 where beam 13 is collimated or refracted such that it is formed into beam 14 which has parallel lines of travel. It will be appreciated that the divergence of beam 13 and accompanying optics are greatly exaggerated for clarity in FIG. 4, and in FIG. 5 to be discussed below.

Figure 2:
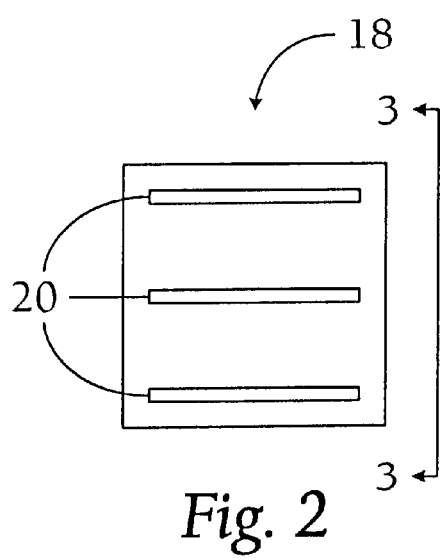
FIG. 2 is a diagrammatic illustration of a three stripe laser emitter source.
Figure 3:
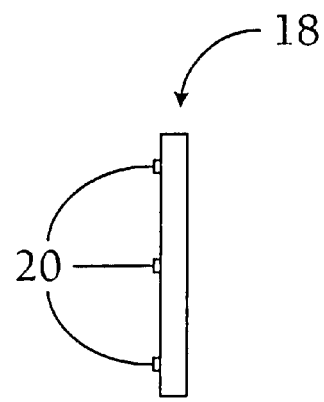
FIG. 3 is a side view of the emitter of FIG. 2 along line 3—3.

IEC 825-1 specifically addresses laser arrays such as illustrated in FIG. 2. According to the standard, when evaluating an array, each emitter 20 must be evaluated separately. For example, three stripe laser emitter 18 illustrated in FIG. 2 may have dimensions of 250 micrometers along each side measured from the edges of emitters 20. Each emitter 20 may have dimensions of 250 micrometers by 1 micrometer. When evaluated separately, the size of each stripe 20 is assumed to be equal to the smallest dimension. Because the stripes 20 are very thin, no advantage is gained by increasing the overall size of emitter 18.

The new class 1 AEL is as follows:

$AEL = 2 \times 10^{-7} \times C_4 \times C_6 \times C_5$ joules (using a 50 millimeter collection aperture).

$C_4$ is determined by the wavelength of the emission. For a gallium-arsenide laser diode having a wavelength of 905 nanometers, $C_4 = 10^{0.002(905-700)}$. Thus, for a wavelength of 905 nanometers, $C_4 = 2.57$.

$C_5$ is a correction factor for pulse lasers. The correction factor $C_5 = N^{-0.25}$, where N=the number of pulses during the exposure period of 100 seconds. Thus, for a laser diode 18 emitting approximately 238 pulses per second, $C_5 = N^{-0.25}$ which is equal to $(100 \times 200)^{-0.25} = 0.08409$.

$C_6$ is a correction factor for angular source size where $C_6 = \alpha/\alpha_{min} < 1$ and where $\alpha$ is the angular source size measured in milliradians (mr) and $\alpha_{min} = 1.5$ mr given the other LIDAR parameters. If $\alpha < \alpha_{min}$, then $C_6$ is set to 1. Because the typical LIDAR emitter appears as three thin stripes, each much thinner than 1.5 mr, the first analysis would indicated that $C_6$ must be set to 1. However, several countries using the IEC-825 standard allow the manufacturers to assume that a degree of magnification must be used to collect laser energy from a device with an emitting aperture greater than 7 mm. Australia for example has included such wording in their adaptation of the IEC-825 standard.

For a 7-millimeter emitter aperture lens, all of the emitted energy can enter the pupil of a person's eye which is defined in IEC-825 as having a diameter of 7 millimeters. However, for an emitter aperture lens greater than 7 millimeters, the unaided eye will intercept only a fraction of the total energy emitted from the LIDAR. For example, a LIDAR having a 50-millimeter emitter aperture lens, only a small fraction of the total energy emitted can be intercepted by an unaided eye. If a 50-millimeter emitter aperture lens in used, then the apparent source size of the emitter must be increased by a factor more than seven times which corresponds to the magnification necessary to compress a 50-millimeter beam down to 7 limeters.

For a 7-millimeter lens, the apparent source size is 3 mr, and the apparent source size for a 50 millimeters lens is 21 mr. Therefore, the energy density on the retina of a person's unaided eye intercepting the laser output from a system using a 50 millimeter emitter aperture lens is seven times less than that of a system using a 7-millimeter emitter aperture lens. Accordingly, the apparent source size $\alpha$, used in calculating $C_6$, should be adjusted for the magnification required to reduce the emitted beam to 7 millimeters. Or, in other words, the power output for a 50-millimeter emitter aperture lens with an apparent source size of 21 mr may be seven times that of a LIDAR using a 7-millimeter lens with an apparent source size of 3 mr.

Essentially the manufacturer may assume that the viewing device uses just enough magnification (up to 7×) to collect the laser energy from the device and compress it into a 7 mm diameter. For example, the LIDAR described herein has an emitted beam diameter of 35 mm. To collect all of the energy from this device, one could use a 5×telescope or monocular with a 35 objective lens diameter. The importance of allowing the assumption of magnification to collect energy from large diameter beams becomes apparent when evaluating the $C_6$ term. The magnification factor is applied to the apparent source size prior to calculating the $C_6$ term thus potentially creating a larger resulting AEL.

For the LIDAR discussed herein, applying the 5×magnification yields an apparent source with the overall dimensions of 15×15 mr consisting once again of three thin stripes. The magnification does apply to the thickness of each individual stripe. However, the stripes are very thin to start with (approximately 0.1 mr) and applying the 5×magnification does not make the thickness exceed the $\alpha_{min}$ of 1.5 mr. Given the 5×magnification, the best interpretation that can be expected from national testing laboratories for the three stripe laser is a $C_6 = 3$. This essentially assumes that each stripe can be treated as an individual laser source with $C_6 = 1$ for each stripe. This is logical because, under a 5×magnification, the source stripes appear to be separated by more than 5 mr. Therefore, given the magnification allowance, the AEL for the standard three stripe LIDAR device would be approximately: $2 \times 10^{-7} \times 2.57 \times 3 \times 0.08409 = 0.1297 \times 10^{-6}$ joules or 129.7 nanojoules.

The transmission pattern of a three stripe laser source as illustrated in FIG. 2, has an apparent size of approximately 3.0×3.0 mr or approximately 0.172×0.172 degrees. However, each stripe 20 taken individually is narrower than $\alpha_{min}$. Since most countries require that the smallest dimension be used for the $C_6$ calculation, the result is usually $C_6 = 1$. According to the standard, when evaluating laser emitter arrays, each emitter 20 must be evaluated separately. When evaluated separately, the size of each stripe 20 is assumed to be equal to the smallest dimension. Because the stripes are very thin, any advantage gained by the overall size of emitter 18 is eliminated.

Figure 5:
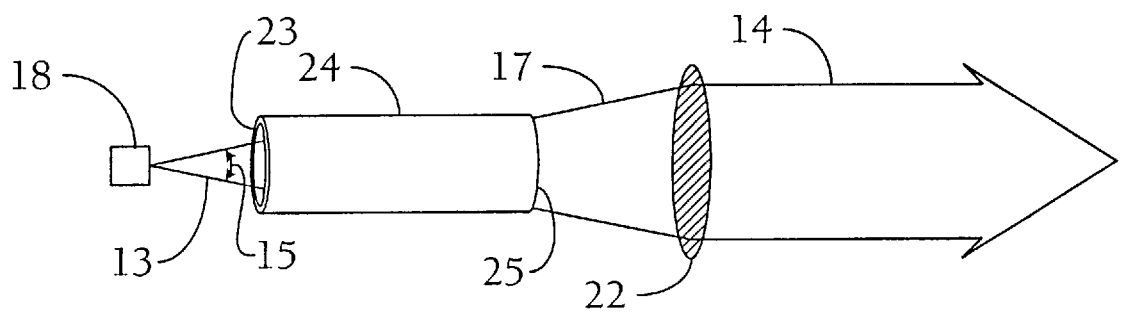
FIG. 5 diagrammatically illustrates a laser system of the present invention with the output of the emitter of FIG. 2 injected into an optical fiber mixer.

Referring to FIG. 5, in the present invention the laser emission 13 from diode 18 is injected into the input end 23 of a large diameter optical fiber 24 in a manner known in the art. Optical fiber 24 may be approximately one to five inches long with an inside diameter of approximately 0.2 to 0.7 millimeters. Typically the inside diameter of fiber 24 is greater than or equal to the transverse dimension of laser emission 13 at the input 23 such that all of the laser energy is injected into fiber 24. However, in some applications it may be advantageous to use a higher power output from emitter 18 and inject only a portion of laser emission 13 into a smaller diameter fiber 24. Using a smaller diameter fiber 24, the LIDAR may incorporate optics with a shorter focal length.

Optical fiber 24 mixes the emissions from each laser emitter stripe 20 resulting in a uniform laser 17 emission at the output 25 of fiber 24 with a diameter of approximately 0.005 radians. The emitted light 17 from the fiber 24 diverges at the same angle as the input cone 15 of laser emission 13. Also, the emitted light 17 from the fiber 24 fills the same lens 22 as shown in FIG. 4.

The overall cross-sectional dimension of beam 14, after passing through the LIDAR optics, is approximately 35 millimeters. According to the IEC 825 standard, when the Australian interpretation is used, the AEL is calculated based on the amount of energy that can enter a 7-millimeter pupil of an eye. Because an unaided eye will intercept only a small fraction of the total energy output in the 35-millimeter beam 14, the apparent source size must be increased by a factor of at least five times due to the magnification required to compress a 35-millimeter beam down to 7 millimeters. In the present invention, a is multiplied by 5 to give 0.25 radians and a resulting $C_6=0.025/0.0015=16.66$. Thus, $AEL=2\times10^{-7}\times C_4 \times C_6 \times C_5$ joules$=(2\times10^{-7})\times 2.57 \times 16.66 \times 0.08409 = 720\times 10^{-9}$ joules or 720 nanojoules per pulse which is approximately 5 times the limit of a laser emitter with an apparent source size of approximately 3 milliradians. Thus, using a fiber mixer to increase the apparent size of the laser source allows an increase in the laser power output and thus increases the range of the LIDAR device.

It is to be understood that while a certain now preferred form of this invention has been illustrated and described, it is not limited thereto except insofar as such limitations are included in the following claims.

Having thus described the invention, what is claimed as new and desired to be secured by Letters Patent is as follows:

1. In a LIDAR device, a method for increasing the usable emitted laser power comprising the steps of:
   providing an emitter source having an at least one emitter stripe for producing a laser pulse, said emitter stripe having a width and a length, wherein said length is greater than said width,
   emitting a laser pulse from said source,
   injecting said emitted laser pulse into a first end of an optical fiber having a transverse dimension greater than said emitter stripe width,
   reshaping said injecting laser pulse within said optical fiber, and
   emitting said reshaped laser pulse from a second end of said optical fiber to provide an output pulse in which the energy of the laser is uniformly spread over an increased area.

2. The method as claimed in claim 1 wherein said reshaped pulse presents a generally circular transmission pattern.

3. The method as claimed in claim 1, wherein said emitter source further comprises a plurality of spaced apart emitter stripes.

4. The method as claimed in claim 3 wherein said transverse dimension of said optical fiber encompases at least a portion of two adjacent emitter stripes.

5. An increased-power laser emitter for a LIDAR device comprising:
   an emitter source having an at least one emitter stripe for producing a laser pulse, said emitter stripe having a width and a length, said stripe length greater than said stripe width,
   an optical fiber having an input, an output spaced from said input, and an inside dimension, said inside dimension greater than said emitter stripe width,
   means for injecting said laser pulse into said input of said optical fiber, and
   means in said fiber responsive to said injected laser pulse for providing a homogeneous laser output pulse from said output having an increased cross-sectional size, thereby increasing the apparent size of the emitter source.

6. The device as claimed in claim 5 wherein said laser output pulse presents a generally circular transmission pattern.

7. The device as claimed in claim 5 wherein said optical fiber inside dimension is greater than said stripe length, whereby substantially all of said laser pulse is injected into said input of said optical fiber.

8. The device as claimed in claim 5 wherein said inside dimension of said optical fiber is approximately 0.2 millimeter to 0.7 millimeter.

9. The device as claimed in claim 5 wherein said emitter source produces said laser pulse with a predetermined transmission pattern, and said optical fiber inside dimension is less than said predetermined transmission pattern, whereby a portion of said laser pulse is injected into said input of said optical fiber.

10. The device as claimed in claim 5, wherein said emitter source further comprises a plurality of spaced apart emitter stripes.

11. The device as claimed in claim 10, wherein said inside dimension of said fiber is greater than the width of two adjacent stripes and the space therebetween.

12. The device as claimed in claim 5, wherein said emitter source has a predetermined length and width and wherein said inside dimension of said fiber is greater than said emitter source predetermined length.

13. The device as claimed in claim 5, wherein said emitter source has a predetermined length and width and wherein said inside dimension of said fiber is greater than said emitter source predetermined width.

14. The device as claimed in claim 5, wherein said emitter source has a predetermined length and width and wherein said inside dimension of said fiber is greater than said emitter source predetermined length and width.

\* \* \* \* \*